United States Patent
Shih

(10) Patent No.: US 7,172,937 B2
(45) Date of Patent: Feb. 6, 2007

(54) METHOD OF MANUFACTURING A NON-VOLATILE MEMORY CELL

(75) Inventor: Chungchin Shih, Hsin-Chu County (TW)

(73) Assignee: United Microelectronics Corp., Hsin-Chu (TW)

( * ) Notice: Subject to any disclaimer, the term of this patent is extended or adjusted under 35 U.S.C. 154(b) by 77 days.

(21) Appl. No.: 10/907,920

(22) Filed: Apr. 21, 2005

(65) Prior Publication Data

US 2006/0240615 A1    Oct. 26, 2006

(51) Int. Cl.
*H01L 21/336* (2006.01)

(52) U.S. Cl. ......... 438/257; 257/E21.68; 257/E21.694; 257/314; 257/315; 257/324

(58) Field of Classification Search ................ 438/257; 257/314, 315, E21.68, E21.694, 324
See application file for complete search history.

(56) References Cited

U.S. PATENT DOCUMENTS

| | | | | |
|---|---|---|---|---|
| 2004/0197995 A1* | 10/2004 | Lee et al. | .................... | 438/257 |
| 2005/0186734 A1* | 8/2005 | Cho et al. | .................... | 438/257 |
| 2006/0043469 A1* | 3/2006 | Park et al. | .................... | 257/324 |
| 2006/0118859 A1* | 6/2006 | Kim et al. | .................... | 257/324 |

* cited by examiner

*Primary Examiner*—Thao P. Le
(74) *Attorney, Agent, or Firm*—Winston Hsu

(57) ABSTRACT

The present invention relates to a method of manufacturing a non-volatile memory cell. The method comprises forming an ONO stack and a mask formed on the ONO stack, providing a first etching process to form a first spacer surrounding the mask, removing portions of the first spacer and the ONO stack that are not covered by the first spacer and the ONO stack, forming an electrical connection layer between the masks, forming a second spacer surrounding the mask, removing the second spacer to form a gate and removing the mask and the ONO stack which is under the mask.

23 Claims, 11 Drawing Sheets

METHOD OF MANUFACTURING A NON-VOLATILE MEMORY CELL

BACKGROUND OF THE INVENTION

1. Field of the Invention

The present invention relates to a method of manufacturing a non-volatile memory cell, and more particularly, to a method of manufacturing a non-volatile memory cell having an oxide-nitride-oxide stack structure.

2. Description of the Prior Art

A flash memory mainly comprises a floating gate for storing electric charge, and a control gate disposed on the floating gate for controlling access of data, where the control gate is separated from the floating gate via a dielectric layer formed by an oxide-nitride-oxide (ONO) structure. Therefore, the memory can utilize a principle of thermal electrons or tunneling to store induced electric charge within the overlapped gates so as to store a signal "O" in the memory. If data stored in the memory needs to be changed, the process is to supply a small extra amount of energy in order to remove electrons stored in the floating gate so as to rewrite data.

The Silicon-Oxide-Nitride-Oxide-Silicon (SONOS) structure is the most common structure of the non-volatile memory cell nowadays. The nitride silicon layer is a charge trapping medium of SONOS. Its floating gate is made by a punching effect or source side injection to save electrons in the floating gate as data. One shortcoming of SONOS is that the electron will punch the floating gate when the tunnel between the source and drain is too short. This becomes a problem with SONOS utilizes a smaller memory size. The other shortcoming of SONOS is a bad erasing effect that results in disordered data. This is why localized oxide-nitride-oxide memory is produced.

The localized oxide-nitride-oxide memory has a better erasing effect because of the localized oxide-nitride-oxide stack structure and the asymmetric structure. The prior localized oxide-nitride-oxide memory manufacture process has at least two photo masks. The first one is formed at the localized oxide-nitride-oxide memory and the other one is formed at the gate. The photo mask pattern becomes dense, however, causing the cost of manufacturing to increase. Because alignment accuracy is low and failure rate is high, the rework cost increases. The oxide-nitride-oxide stack structure is always inconsistent and the performance of the memory is not ideal.

Therefore, to develop a method of manufacturing the localized oxide-nitride-oxide memory to solve the above problem is very important.

SUMMARY OF THE INVENTION

The present invention provides a method of manufacturing the non-volatile memory cell to solve the above problems.

The embodiment according to the present invention provides a method of manufacturing a non-volatile memory cell. The method comprises providing a semiconductor substrate, forming an oxide-nitride-oxide stack structure in the semiconductor substrate, forming a plurality of masks in the oxide-nitride-oxide stack structure, forming a first spacer around the mask, removing portions of the oxide-nitride-oxide stack structure that are not covered by the first spacer and the mask, removing the first spacer, forming an electrical conduction layer between the masks, where the height of the electrical conduction layer is lower than the height of the mask, forming a plurality of second spacers around the mask in the electrical conduction layer, removing portions of the electrical conduction layer that are not covered by the second spacer, and removing the second spacer, the mask and portions of the oxide-nitride-oxide stack structure that are covered by the mask cover.

Then other embodiments according to the present invention is provides a method of manufacturing a non-volatile member cell. The method comprises providing a semiconductor substrate, forming a trapping layer in the semiconductor substrate, forming a plurality of masks in the trapping layer, forming a first spacer around the mask, removing portions of the trapping layer that are not covered by the first spacer and the mask, removing the first spacer, forming an electrical conduction layer between the masks, where the height of the electrical conduction layer is lower than the height of the masks, forming a plurality of second spacers around the mask in the electrical conduction layer, removing portions of the electrical conduction layer that are not covered by the second spacer, and removing the second spacer, the mask and positions of the trapping layer that are covered by the mask.

The present invention uses spacers as self-alignment masks to form the oxide-nitride-oxide stack structure and the gate. Therefore, the present invention has no redundant masks as in the prior art, which decreases the rework rate. The oxide-nitride-oxide stack structure according to the present invention is consistent and the memory performs stably.

These and other objectives and advantages of the present invention will no doubt become obvious to those of ordinary skill in the art after reading the following detailed description of the preferred embodiment that is illustrated in the various figures and drawings.

DETAILED DESCRIPTION OF THE PREFERRED EMBODIMENT

Figure 1:
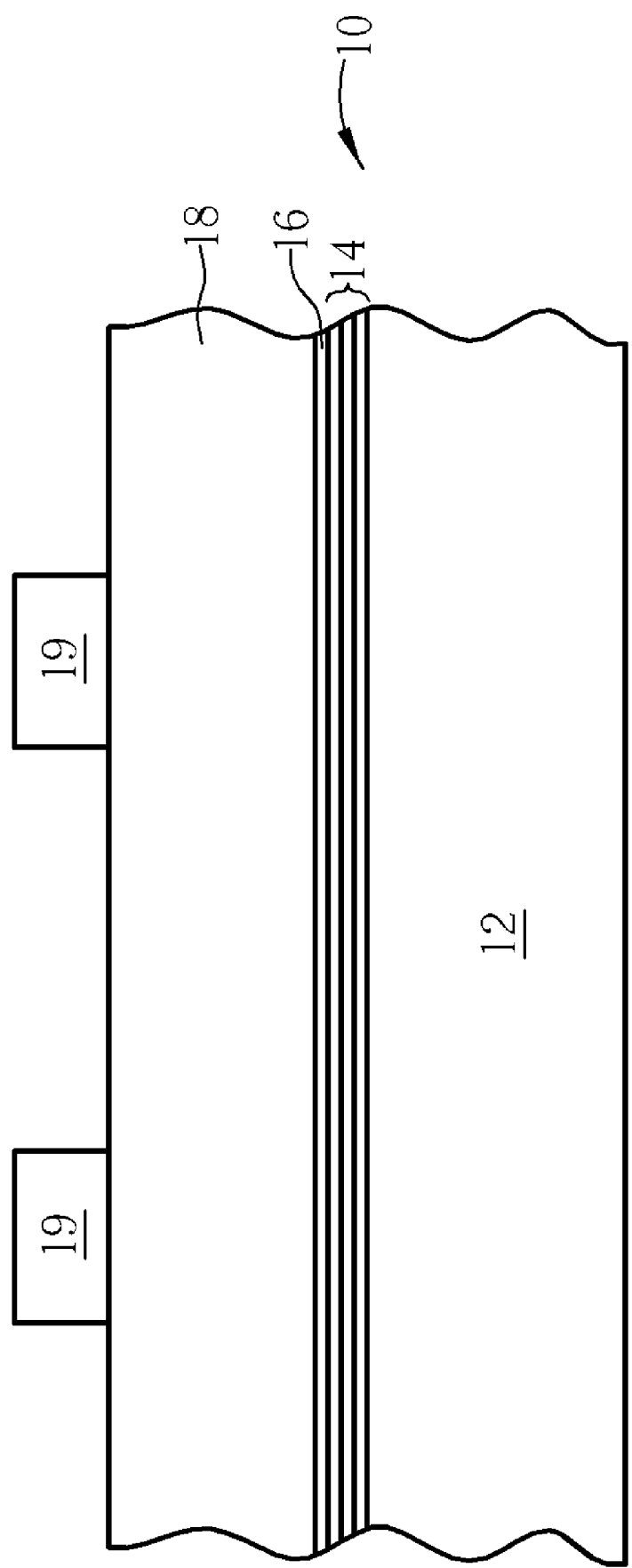
FIGS. 1 to 11 are flowcharts of the method of manufacturing the non-volatile memory cell according to the present invention.

Pleas refer to FIGS. 1 to 11. FIGS. 1 to 11 are flowcharts of the method of manufacturing the non-volatile memory cell according to the present invention. Please reer to FIG. 1. In FIG. 1 the semiconductor chip 10 is formed with thermal oxidation, chemical vapor deposition and a priming process to respectively form the oxide-nitride-oxide stack structure 14, the mask layer 18 and the resist layer (not shown). A photolithography process is provided and the resist layer is exposed by a mask pattern (not shown) to form the resist mask 19. The portions of the mask layer 18 that are not covered by the resist mask 19 are removed by an etching process so as to form the masks 22. Please note that the methods of forming the mask 22 are not limited to the photolithography and etching process, but can also include forming the mask 22 by a photo-chemical low-k material directly.

Figure 2:
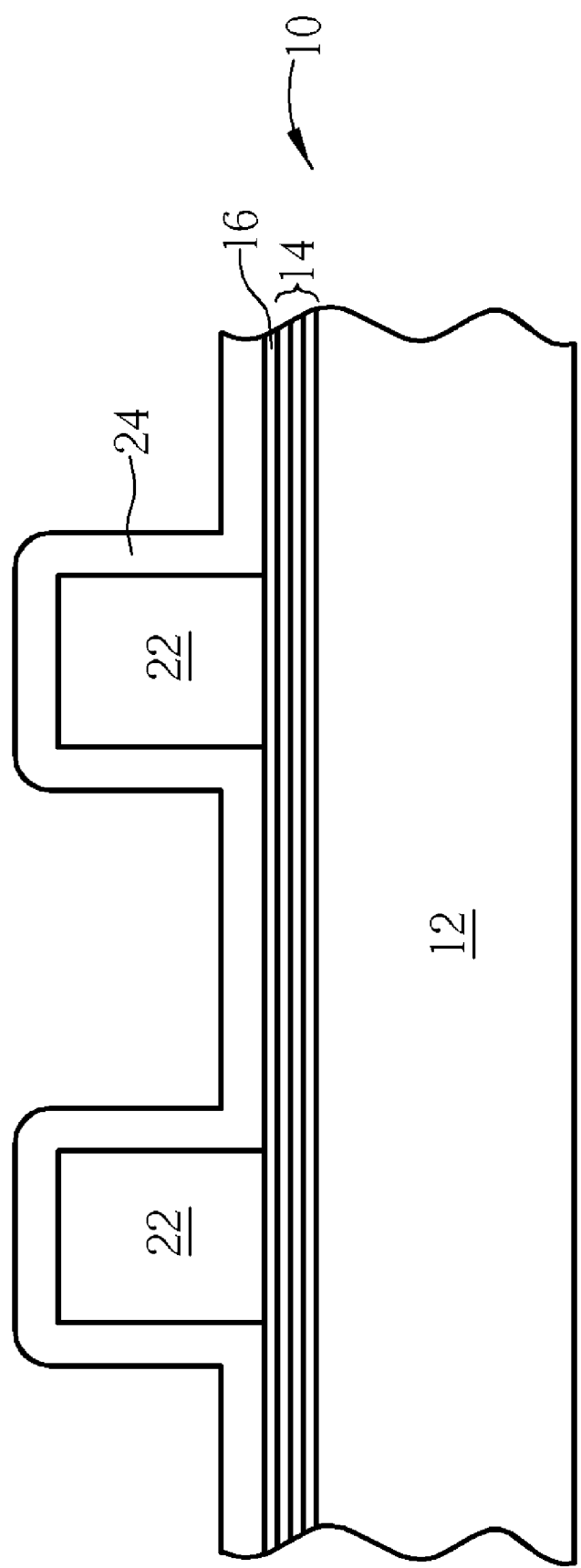
Figure 3:
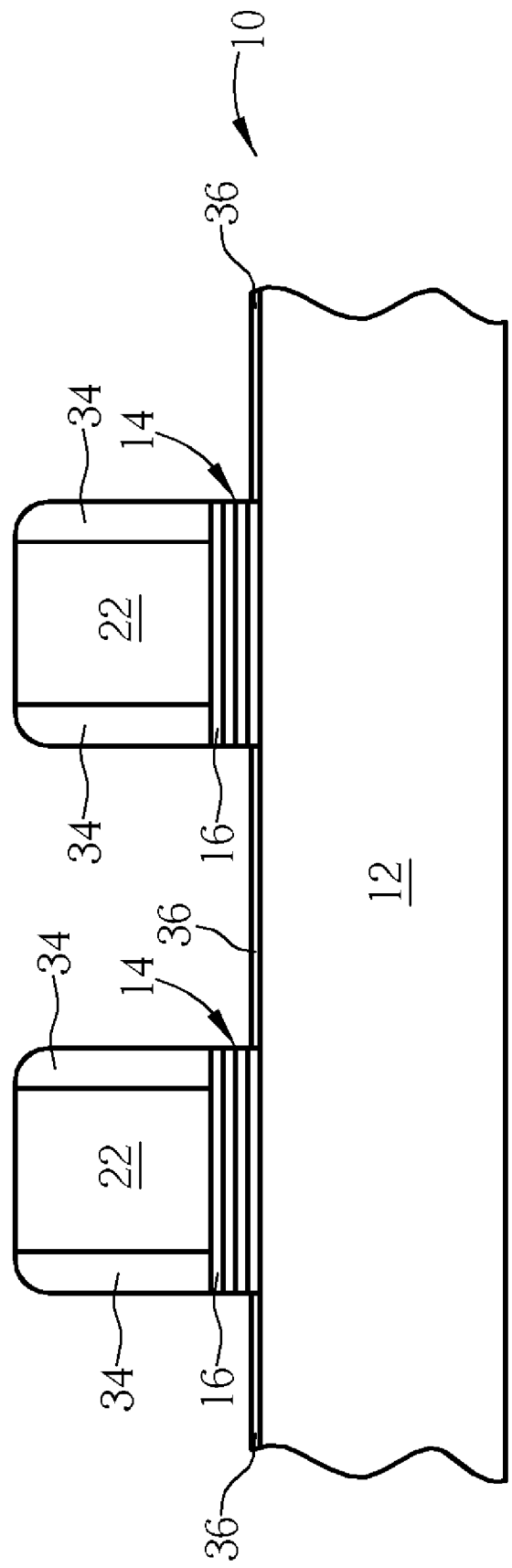

Please refer to FIG. 2. After removing the resist mask 19, the spacer 34 surrounding the mask 22 and surrounding the oxide-nitride-oxide stack structure 14 is formed by depositing the spacer layer 24 and etching the spacer layer 24 back until reaching the surface of the oxide-nitride-oxide stack structure 14. Then, the spacer 34 is a self-aligned mask enabling the etching process to remove portions of the oxide-nitride-oxide stack structure 14 that are not covered by the mask 22 and the spacer 34. The mask 22 and the spacer 34 surrounding the mask 22 are formed as in FIG. 3.

Especially, the buffer nitride 16 is etching stop layer to protect the completeness of the oxide-nitride-oxide stack structure 14, when the mask layer 18 is etched. The lowest oxide silicon layer 36 of the oxide-nitride-oxide stack structure 14 is etching stop layer for avoiding the surface of the semiconductor chip 10 being polluted, when the spacer 34 is the self-aligned mask, and the buffer nitride layer 16 and the partial oxide-nitride-oxide stack structure 14 are etched. Otherwise, the materials of the buffer nitride layer 16, the mask layer 18 and the spacer layer 24 are changed according to the condition of the process, the product design and the uniform of the etching process. The materials are considered when determining the etching ratio.

Figure 4:
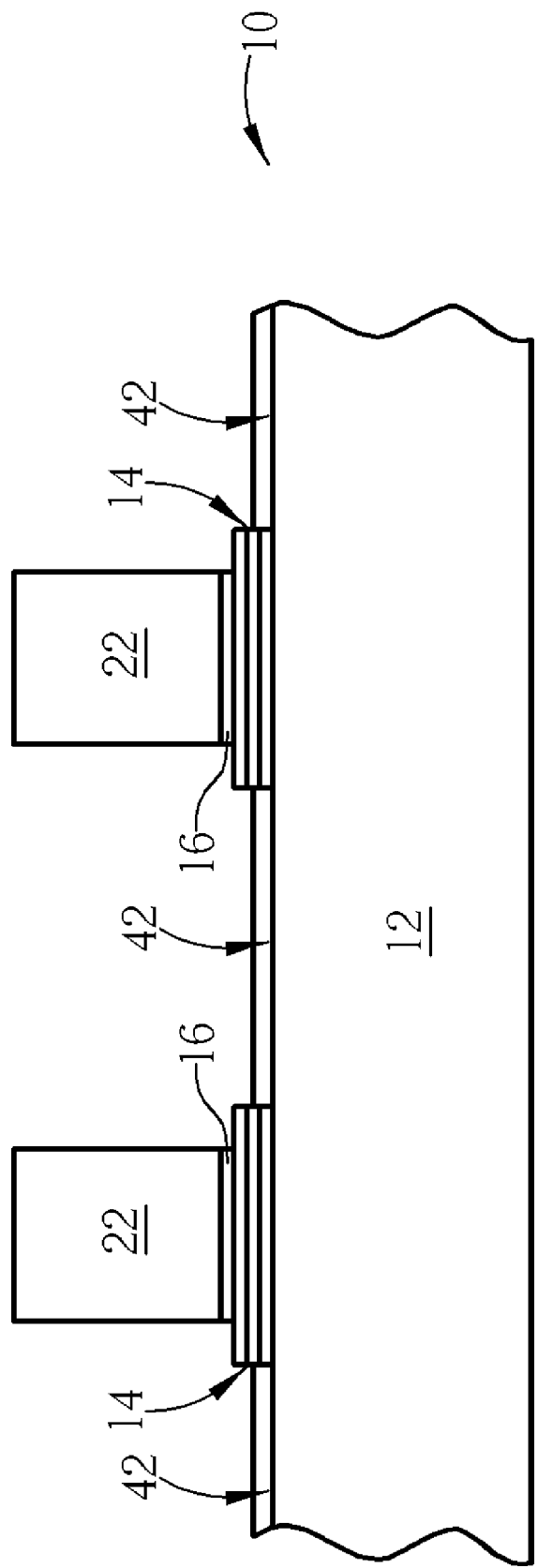

Please refer to FIG. 4. The spacer 34 and portions of the buffer nitride layer 16 that are covered by the spacer 34 are removed. The gate oxide layer 42 is formed between any two adjacent oxide-nitride-oxide stack structures 14 by the thermal oxidation process. Before forming the gate oxide layer 42, the oxide-nitride-oxide stack structure 14 could be removed completely.

Figure 5:
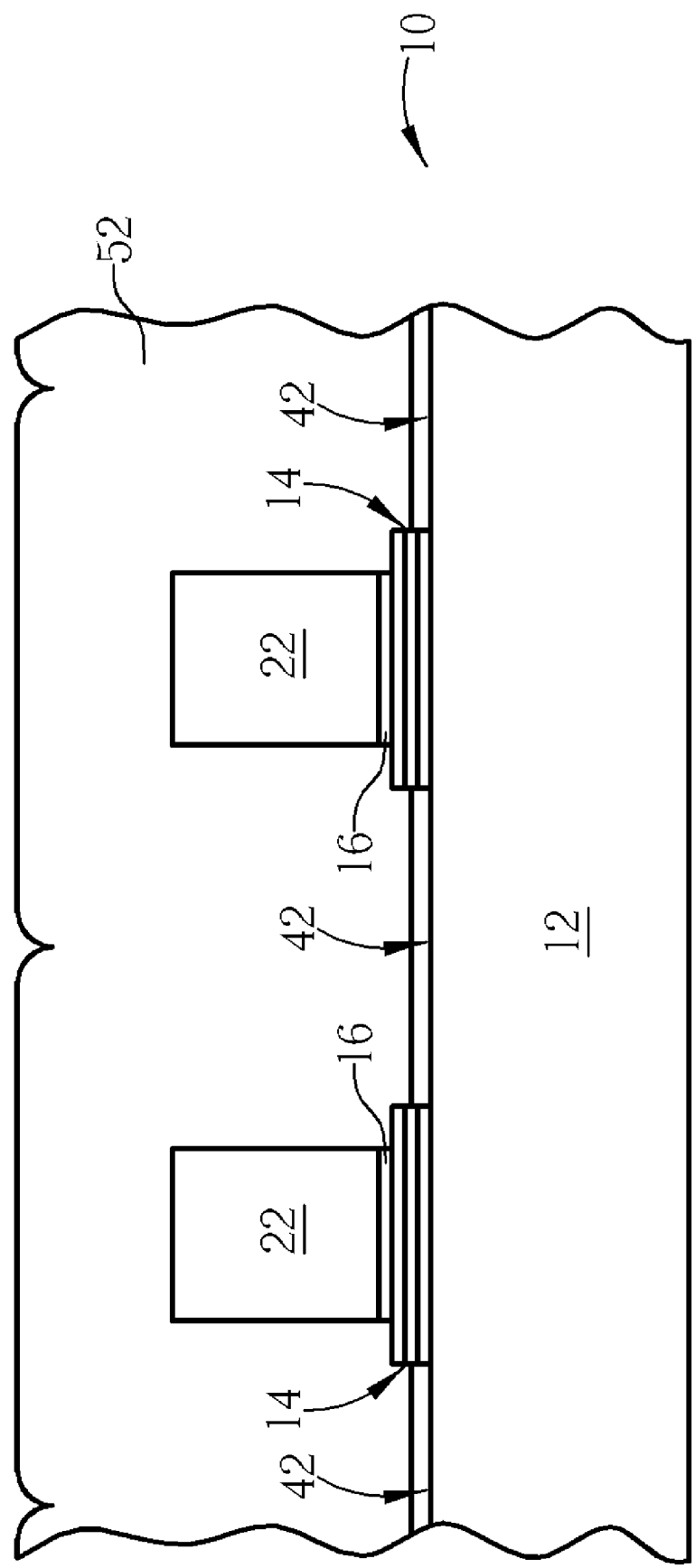
Figure 6:
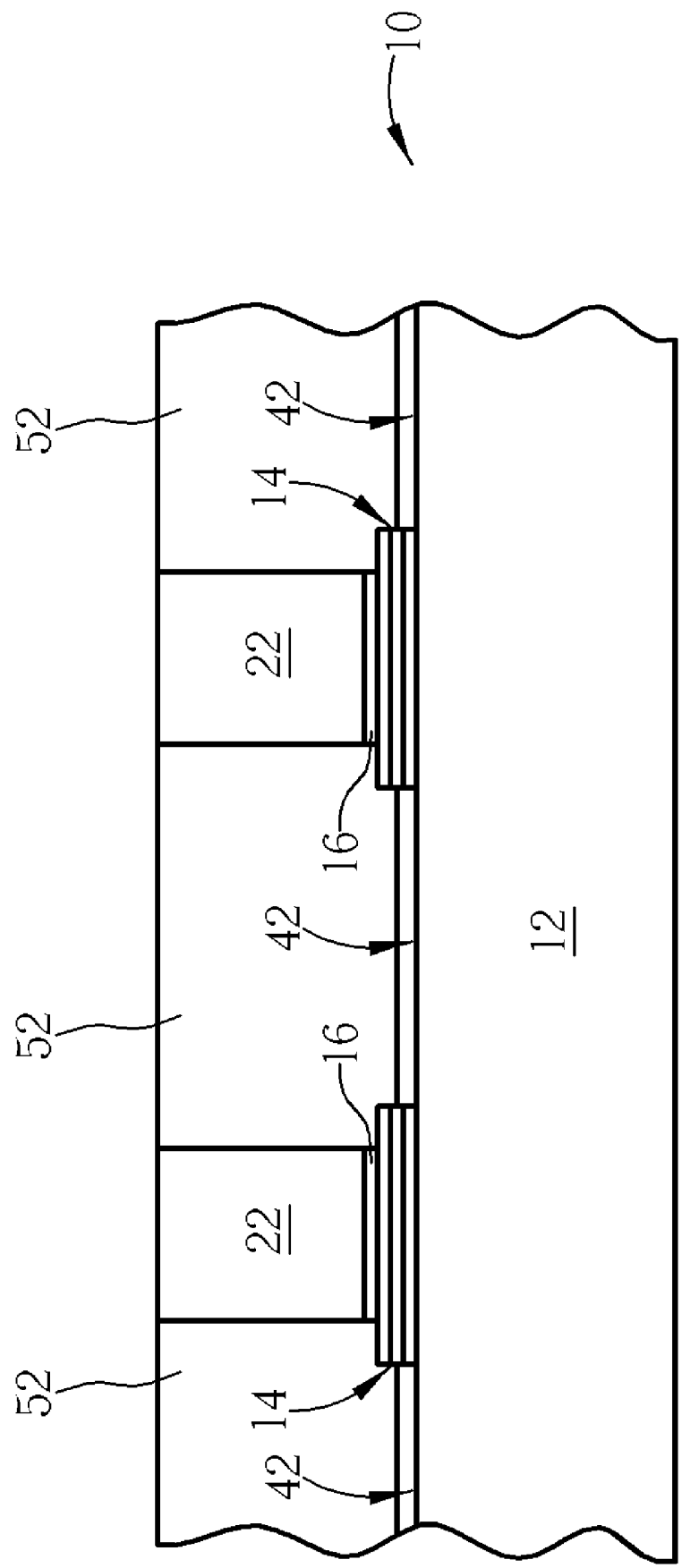
Figure 7:
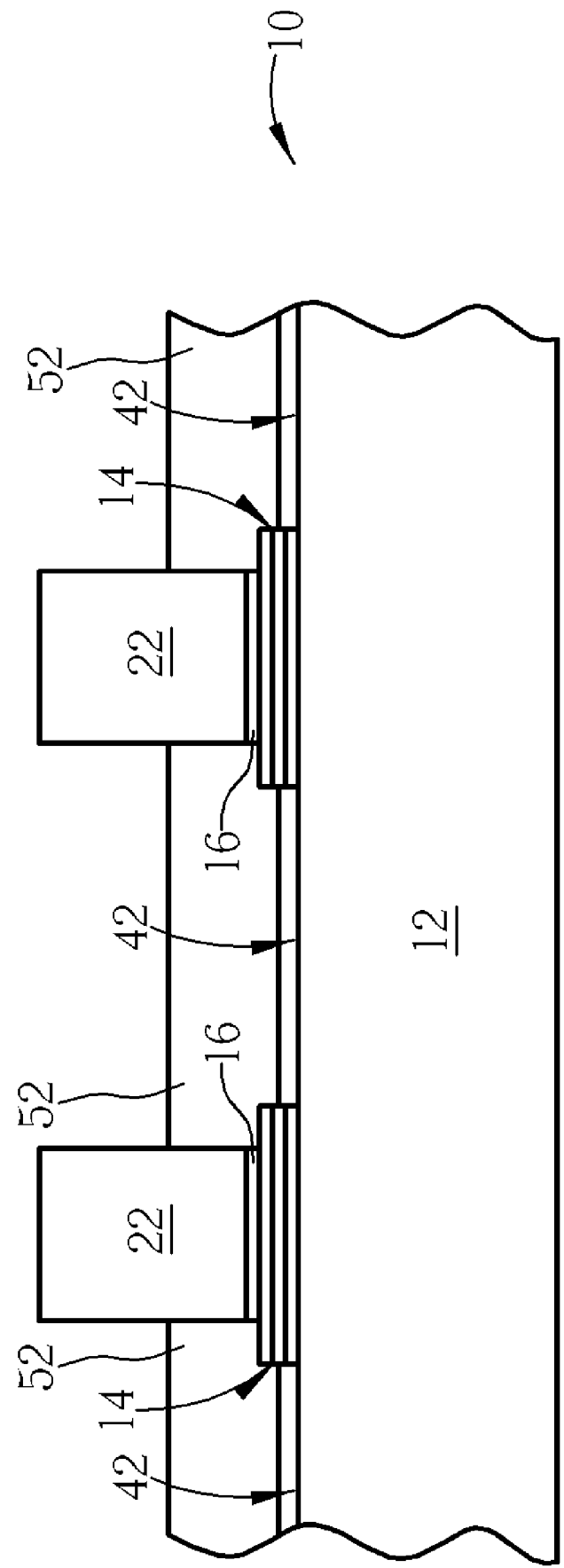

Please refer to FIG. 5. The electrical conduction layer 52 is deposited on the semiconductor chip 10 uniformly. The material of the electrical conduction layer 52 could be a polycrystalline silicon layer, a silicide layer and a polycrystalline silicon layer and a silicide layer combined layer. Then, chemical mechanical polishing (CMP) of the electrical conduction layer 52 occurs until the mask 22 is reached, so that the electrical conduction layer 52 and the mask 22 have the same height as in FIG. 6. The electrical conduction layer 52 is thereafter etched by the etching back process until the electrical conduction layer 52 is lower than the mask 22 as in FIG. 7.

Figure 8:
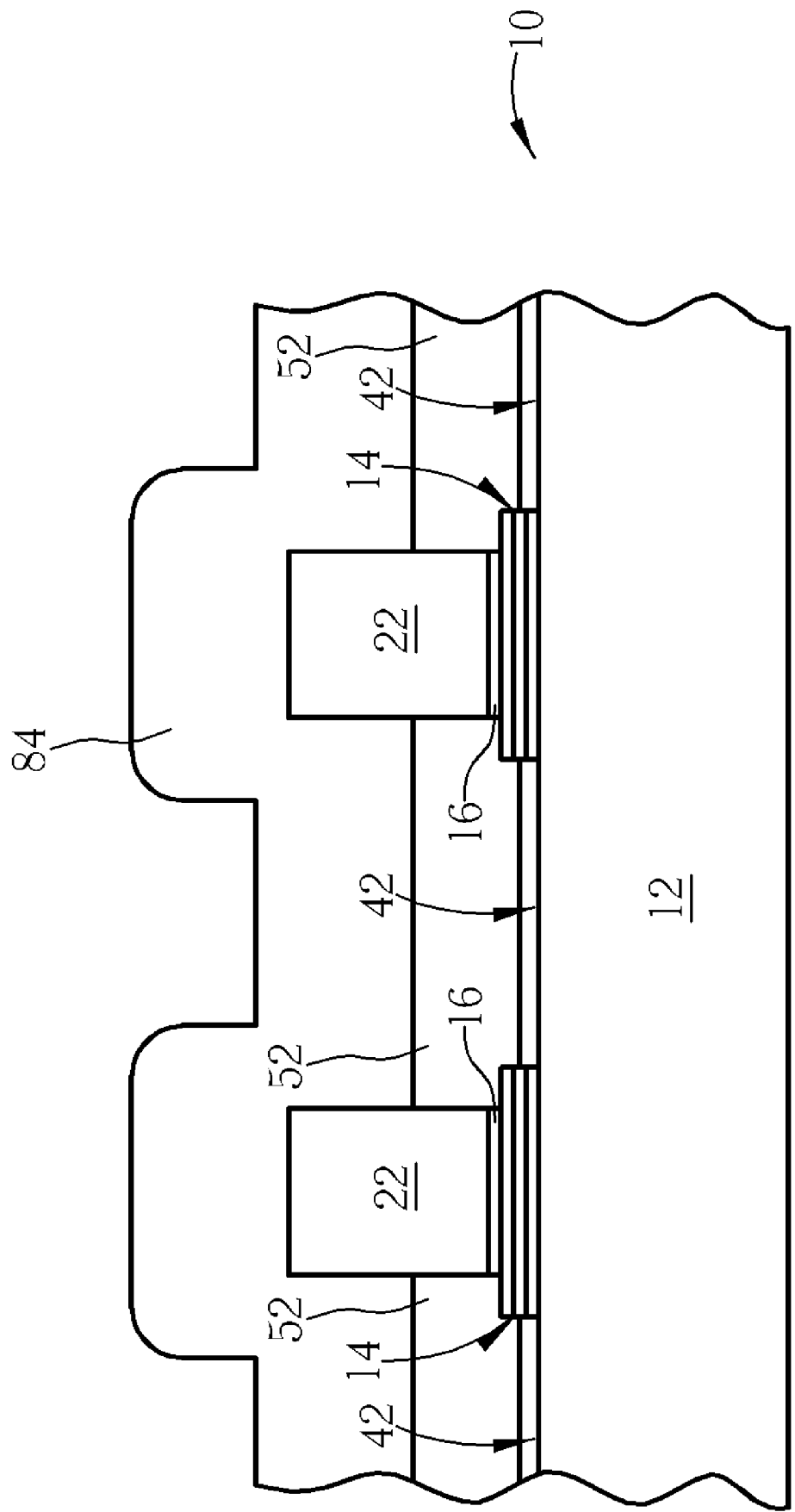
Figure 9:
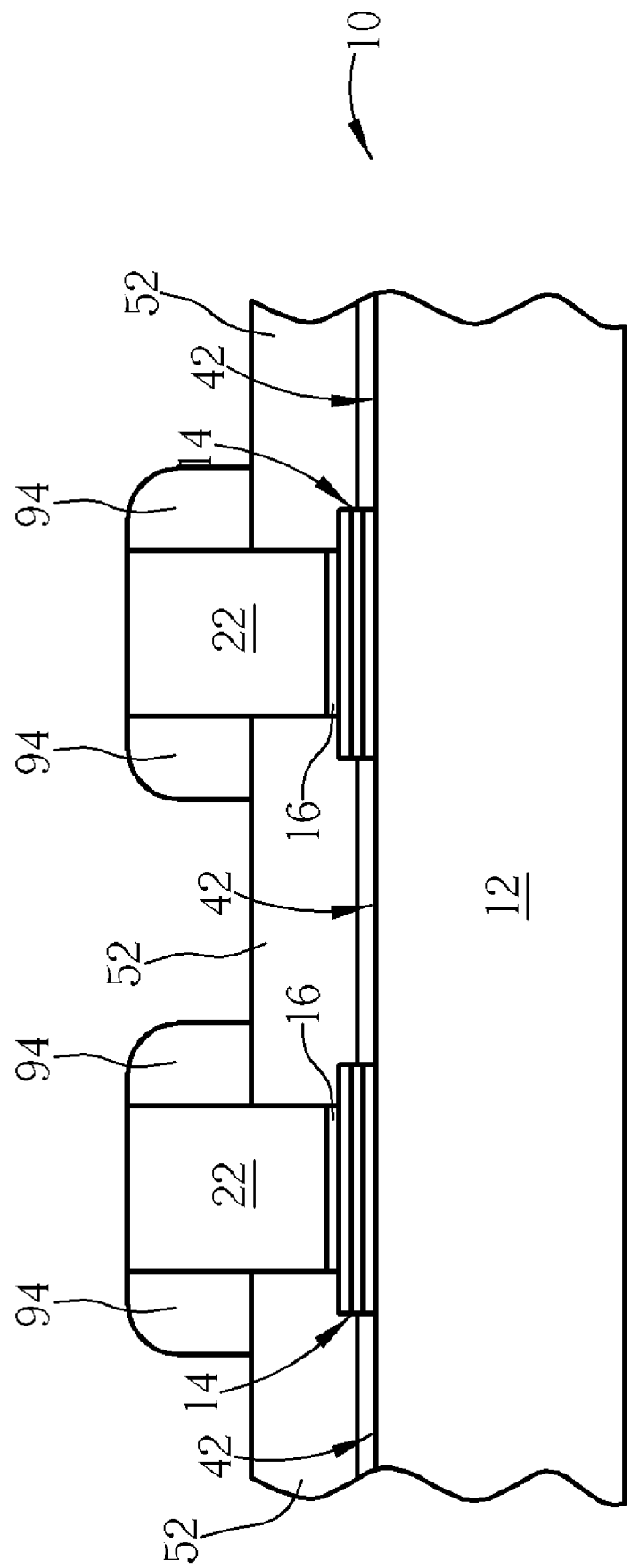
Figure 10:
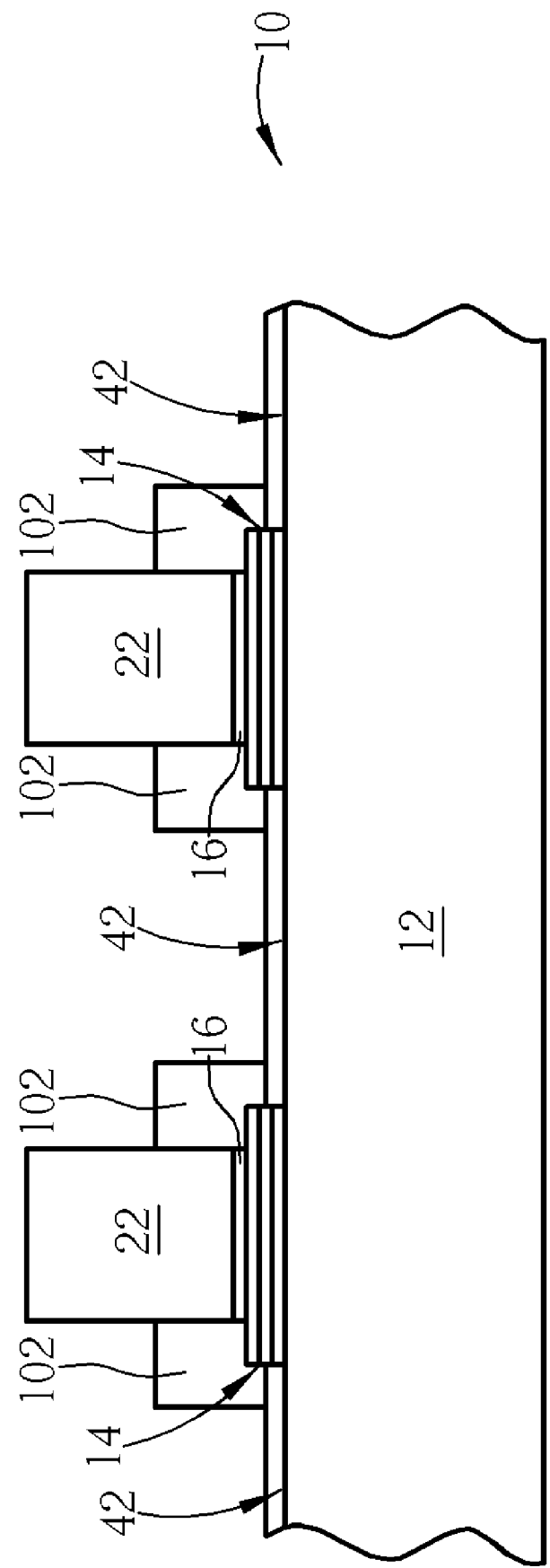
Figure 11:
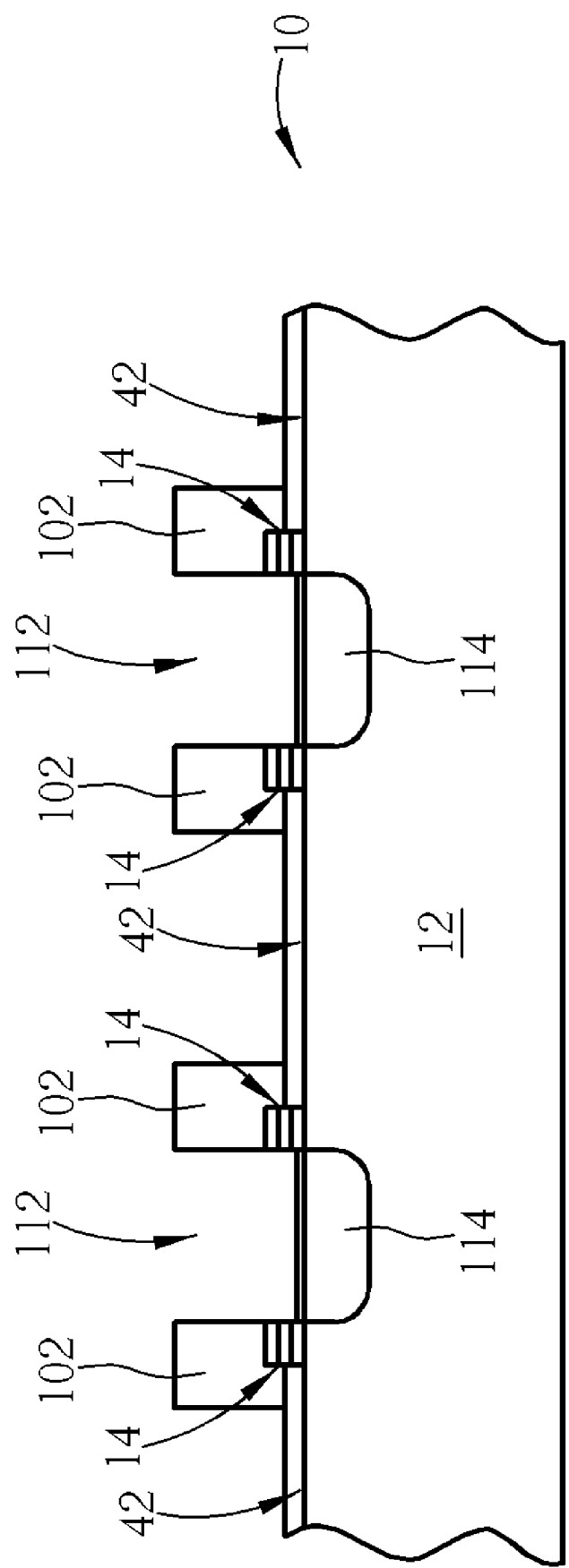

The semiconductor chip 10 has a spacer layer 84 deposited on it as in FIG. 8. The spacer layer 84 is etched by the etching back process until the surface of the semiconductor chip 10 is reached, and the spaces 94 surrounding the mask 22 is formed as in FIG. 9. The spacer 94 is the gate mask for the gate self-aligned etching process and the etching process etches the electrical conduction layer 52 to form the gate 102 as in FIG. 10. Providing a doping process driving ions into the side of the gate 102 without connecting with the mask 22 to form the drain (not shown). Next, the spacer 94 is removed by the etching process.

Thereafter, the mask 22, portions of the buffer nitride layer 16 that are covered by the mask 22, and portions of the oxide-nitride-oxide stack structure 14 that are covered by the mask 22 are removed. Then, the source domain 112 is doped by ions to from the source 114 in the original position of the mask 22. The dielectric layer (not shown) is formed on the semiconductor chip 10. The contact window (not shown) is formed on the individual drain (not shown) by the photolithography and etching process. The contact window is filled with metal to form the metal contact and the multilevel interconnection, and the passivation layer is formed finally. The non-volatile memory cell is completely constructed.

Compare to the prior art, the oxide-nitride-oxide memory according to the prior art has at least two photo masks. The first one is formed at the localized oxide-nitride-oxide memory and the other one is formed at the gate. But, the photo mask pattern becomes dense and the cost of the manufacturing process increases. Because the alignment accuracy is low and the failure rate is high, the rework cost also increases. The oxide-nitride-oxide stack structure according to the prior art is always inconsistent and the performance of the memory is not sufficient. However, the present invention uses spacers 34, 39 as the self-aligned masks to form the oxide-nitride-oxide stack structure 14 and the gate 102 respectively. Therefore, the present invention has no redundant mask as the prior art, decreasing the rework rate. Furthermore, the oxide-nitride-oxide stack structure is consistent and memory performances stably.

Those skilled in the art will readily observe that numerous modifications and alterations of the method may be made without while retaining the teachings of the invention. Accordingly, the above disclosures should be construed as limited only by the metes and bounds of the appended claims.

What is claimed is:

1. A method of manufacturing a non-volatile memory cell comprising:
 providing a semiconductor substrate;
 forming an oxide-nitride-oxide stack structure in the semiconductor substrate;
 forming a plurality of masks in the oxide-nitride-oxide stack structure;
 forming a first spacer around the mask;
 removing portions of the oxide-nitride-oxide stack structure that are not covered by the first spacer and the mask;
 removing the first spacer;
 forming an electrical conduction layer between the masks, where the height of the electrical conduction layer is lower than the height of the mask;
 forming a plurality of second spacers around the mask in the electrical conduction layer;
 removing portions of the electrical conduction layer that are not covered by the second spacer; and
 removing the second spacer, the mask and portions of the oxide-nitride-oxide stack structure that are covered by the mask.

2. The method of claim 1, wherein the mask is made by depositing a mask layer above the oxide-nitride-oxide stack structure and utilizing a photolithography process.

3. The method of claim 1, wherein the first spacer is made by depositing a first spacer layer above the mask and utilizing an etching back process to etch the first spacer layer until the surface of the oxide-nitride-oxide stack structure is reached.

4. The method of claim 1, wherein the oxide-nitride-oxide stack structure comprises a buffer nitride layer above the oxide-nitride-oxide stack structure and the plurality of masks is formed in the surface of the buffer nitride layer.

5. The method of claim 4, wherein the process of removing the portions of the oxide-nitride-oxide stack structure that are not covered by the first spacer and the mask comprises removing portions of the buffer nitride layer that are not covered by the first spacer and the mask simultaneously.

6. The method of claim 1, wherein the method further comprises:
 forming a gate oxide layer between any two of the oxide-nitride-oxide stack-structures in the semiconductor substrate after the first spacer is removed.

7. The method of claim 1, wherein the electrical conduction layer is formed by an electrical conduction layer deposition, a chemical mechanical polishing process and an electrical conduction layer etching back process.

8. The method of claim 1, wherein the second spacer is made by depositing a second spacer layer above the mask and utilizing an etching process to etch until the surface of the electrical conduction layer is reached.

9. The method of claim 8, wherein the second spacer is a self-alignment gate mask for defining the gate of the non-volatile memory cell.

10. The method of claim 1, wherein the method further comprises forming a drain of the non-volatile memory cell before removing the second spacer, the mask and portions of the oxide-nitride-oxide stack structure that are covered by the mask.

11. The method of claim 1, wherein the method further comprises forming a source of the non-volatile memory cell after removing the second spacer, the mask and portion of the oxide-nitride-oxide stack structure that are covered by the mask.

12. A method of manufacturing a non-volatile memory cell comprising:
providing a semiconductor substrate;
forming a trapping layer in the semiconductor substrate;
forming a plurality of masks in the trapping layer;
forming a first spacer around the mask;
removing portions of the trapping layer that are not covered by the first spacer and the mask;
removing the first spacer;
forming an electrical conduction layer between the masks, where the height of the electrical conduction layer is lower than the height of the mask;
forming a plurality of second spacers around the mask in the electrical conduction layer;
removing portions of the electrical conduction layer that are not covered by the second spacer; and
removing the second spacer, the mask and portions of the trapping layer that are covered by the mask.

13. The method of claim 12, wherein the trapping layer is made from an oxide-nitride-oxide stack structure.

14. The method of claim 12, wherein the mask is made by depositing a mask layer above the oxide-nitride-oxide stack structure and utilizing a photolithography process.

15. The method of claim 13, wherein the first spacer is made by depositing a first spacer layer above the mask and utilizing an etching back process to etch the first spacer layer until the surface of the oxide-nitride-oxide stack structure is reached.

16. The method of claim 13, wherein the oxide-nitride-oxide stack structure comprises a buffer nitride layer above the oxide-nitride-oxide stack structure and the plurality of masks is formed in the surface of the buffer nitride layer.

17. The method of claim 16, wherein the process of removing portions of the oxide-nitride-oxide stack structure that are not covered by the first spacer and the mask comprises removing portions of the buffer nitride layer that are not covered by the first spacer and the mask simultaneously.

18. The method of claim 13, wherein the method further comprises forming a gate oxide layer between any two of the oxide-nitride-oxide stack structures in the semiconductor substrate after the first spacer is removed.

19. The method of claim 13, wherein the electrical conduction layer is formed by an electrical conduction layer deposition, a chemical mechanical polishing process and an electrical conduction layer etching back process.

20. The method of claim 13, wherein the second spacer is made by depositing a second spacer layer above the mask and utilizing an etching back process to etch until the surface of the electrical conduction layer is reached.

21. The method of claim 20, wherein the second spacer is a self-alignment gate mask for defining the gate of the non-volatile memory cell.

22. The method of claim 13, wherein the method further comprises forming a drain of the non-volatile memory cell before removing the second spacer, the mask and portions of the oxide-nitride-oxide stack structure that are covered by the mask.

23. The method of claim 13, wherein the method further comprises forming a source of the non-volatile memory cell after removing the second spacer, the mask and portions of the oxide-nitride-oxide stack structure that are covered by the mask.

* * * * *